United States Patent [19]

Kidai et al.

[11] Patent Number: 5,157,540

[45] Date of Patent: Oct. 20, 1992

[54] ELECTROCHROMIC DISPLAY DEVICE WITH IMPROVED ABSORPTION SPECTRUM AND METHOD OF PRODUCING IT

[75] Inventors: Masayuki Kidai, Otsu; Takashi Taniguchi, Shiga, both of Japan

[73] Assignee: Toray Industries, Inc., Japan

[21] Appl. No.: 637,305

[22] Filed: Jan. 3, 1991

[30] Foreign Application Priority Data

Jul. 11, 1990 [JP] Japan .................. 2-183426

[51] Int. Cl.$^5$ .................. G02F 1/01; G02F 1/17
[52] U.S. Cl. .................. 359/273; 359/267; 359/269
[58] Field of Search .................. 350/357; 340/707, 708; 359/267, 269, 273

[56] References Cited

U.S. PATENT DOCUMENTS

| | | | |
|---|---|---|---|
| 4,174,152 | 11/1979 | Giglia et al. | 350/357 |
| 4,599,614 | 7/1986 | DeBerry et al. | 340/707 |
| 4,810,067 | 3/1989 | Demiryont | 350/357 |
| 4,824,221 | 4/1989 | Endo et al. | 350/357 |
| 4,887,890 | 12/1989 | Scherber et al. | 350/357 |
| 4,889,414 | 12/1989 | Rauh et al. | 350/357 |
| 4,902,110 | 2/1990 | Green | 350/357 |
| 4,938,571 | 7/1990 | Cogan et al. | 350/357 |

Primary Examiner—William Mintel
Assistant Examiner—Mahshid Saadat
Attorney, Agent, or Firm—Austin R. Miller

[57] ABSTRACT

An all solid type electrochromic display device comprises first and second conductive layers and sandwiched between them, at least, an electrochromic layer of tungsten oxide and a solid electrolyte layer. The tungsten oxide of the electrochromic layer has an absorption spectrum, as measured by FT-IR, which meets the following formulae (A) and (B):

$$2.0 \leq \frac{A^* - A_{1800}}{(A_{1400} - A_{1800}) \times 0.44} \leq 5.0 \quad (A)$$

$$1.5 \leq \frac{A_{3400} - A_{4000}}{(A_{2500} - A_{4000}) \times 0.40} \leq 5.0 \quad (B)$$

wherein A1400, A1800, A2500 and A4000 and A3400 respectively represent the absorbance of 1400cm$^{-1}$ 1800cm$^{-1}$, 2500cm$^{-1}$, 4000cm$^{-1}$ and 3400cm$^{-1}$ and A* represents the highest absorbance within a range from 1600cm$^{-1}$ to 1650cm$^{-1}$. The electrochromic display device is produced by vacuum depositing the tungsten oxide electrochromic layer on another layer.

21 Claims, 3 Drawing Sheets

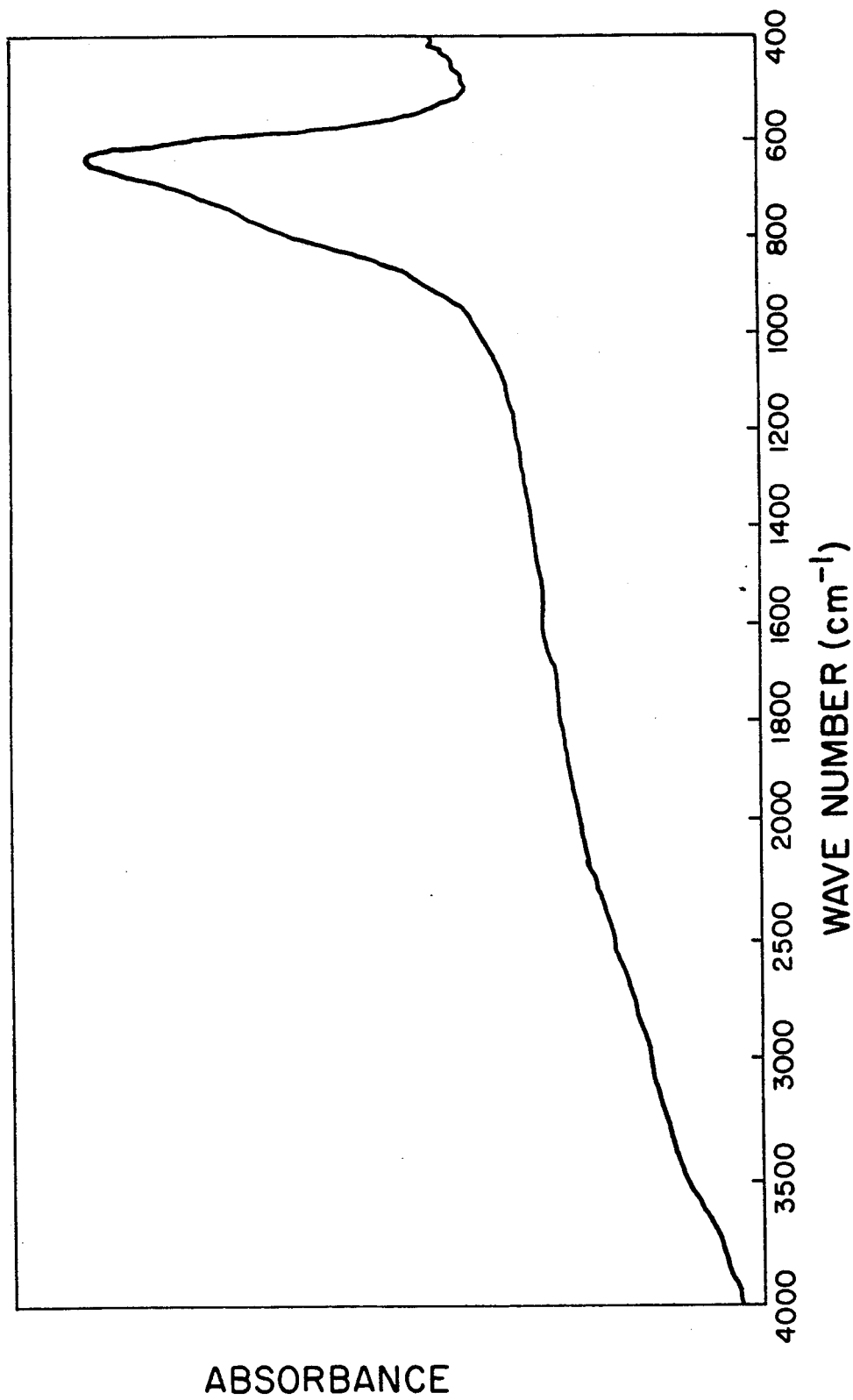

ELECTROCHROMIC DISPLAY DEVICE WITH IMPROVED ABSORPTION SPECTRUM AND METHOD OF PRODUCING IT

BACKGROUND OF THE INVENTION

The present invention relates to an electrochromic display device and also to a method of producing it.

In general, an electrochromic display device (hereinafter termed as ECD) is a non-light emitting type display device relying upon electrochromism (hereinafter termed as EC) wherein an optical absorption spectrum changes reversibly and causes coloration or bleaching when an electric field or current is applied. The characteristic of the ECD is to decrease eye strain due to it being of a non-light emitting type display as compared with the light emitting type displays such as those provided by electroluminescence display devices, plasma display devices, and CRTs. In addition, the ECD has excellent properties such as non-dependence upon the viewing angle, multicoloration of the device itself and a possible enlargement of areas as compared with other non-light emitting type display devices such as liquid crystal display devices.

Transition metal oxides have often been used as EC substances which cause colouring or bleaching, together with an oxidation or reduction reaction by injection or ejection of ions and electrons by application of voltage. Thus, a known ECD comprises a display electrode and an opposite electrode which together sandwich one, two or more than two EC substance layers and an electrolyte layer which provides ions to the EC substance layer.

An earlier disclosure, pertaining to vacuum deposition, is found in JP-A-60-238818, in which tungsten oxide is used as an EC substance and an inert gas, namely argon, is introduced as the gas providing the atmosphere in which reaction is to take place. Such conventional processes are carried out at high temperatures (in the region of 280° C.) and very low vacuum ($<10^{31\ 5}$ torr)

Attempts have been made to use an ECD as a writable display device capable of illustrating letters or figures by means of a surface writing electrode.

The term "write" used herein means "cause a colouring reaction in a specified area to be coloured". In addition, the term "writable" refers to a state where the coloured portion may be sufficiently identified without spreading or narrowing which causes unclearness, and the written letters or figures are clearly identified. Conventional displays such as a liquid crystal display and CRTs have been developed as writable devices of the surface writing electrode type provided with a location detecting function by electrostatic induction.

The following writable ECDs have been proposed. A method is found in U.S. reissued Pat. No. 28,199, in which writing can be performed by contacting an exposed EC layer directly with a writing electrode. Methods are also proposed in JP-A-255920, JP-A-62-267727, JP-A-62-267728 and JP-A-62-286024, wherein at least one of an electrode, EC substance layer and an electrolyte layer is divided into minute, discrete, "pixels", which prevent spreading of the coloured area, thereby enabling ECD to be writable. A method is employed in JP-A-62-156720, in which the ECD may be writable by application of pressure upon such units with a pen, coloration being produced by applying, in advance, a voltage less than a coloration threshold, followed by applying a voltage which exceeds the threshold as a result of the pressure of the pen.

There are, however, drawbacks in each of the above drawn devices. For example, the method disclosed in U.S. reissued Pat. No. 28,199 in which the exposed EC layer is contacted with the writing electrode has defects in that the coloured area overspreads and becomes difficult to read, and the EC layer degrades severely and may not withstand repeated use. On the other hand, as an alternative embodiment, also disclosed in this document, in which the entire EC layer is covered by a conductive layer, the application of a writing electrode to this causes coloration of the entire EC layer.

The method disclosed in JP-A-62-255920- required a complicated patterning process of minute pixels. The method disclosed in JP-A-62-156720 has a defect in that the configuration and circuits of the ECD cell are complicated and it is difficult to use a solid electrolyte. The method disclosed in JP-A-60-238818 is not writable.

SUMMARY OF THE INVENTION

We find surprisingly that by providing, as the material of the EC layer, a tungsten oxide having particular absorption characteristics, the above-described technical disadvantages of the known devices can be minimised or overcome. This enables the production of a suitable and durable all solid type EC device.

According to one aspect of the present invention, there is provided an electrochromic display device comprising a first conductive layer capable of electrical connection to a writing electrode, a second conductive layer spaced from the first conductive layer and adapted to receive an electrical charge, and, sandwiched between the said first and second conductive layers, at least an electrochromic layer of tungsten oxide and a solid electrolyte layer, wherein the tungsten oxide of the electrochromic layer has an absorption spectrum, as measured by FT-IR, which meets the following formulae (A) and (B):

$$2.0 \leq \frac{A^* - A_{1800}}{(A_{1400} - A_{1800}) \times 0.44} \leq 5.0 \quad (A)$$

$$1.5 \leq \frac{A_{3400} - A_{4000}}{(A_{2500} - A_{4000}) \times 0.40} \leq 5.0 \quad (B)$$

wherein $A_{1400}$, $A_{1800}$, $A_{2500}$ and $A_{4000}$ and $A_{3400}$, respectively represent the absorbance at 1400 cm$^{-1}$, 1800 cm$^{-1}$, 2500 cm$^{-1}$, 4000 cm$^{-1}$ and 3400 cm$^{-1}$ and $A^*$ represents the highest absorbance within a range from 1600 cm$^{-1}$ to 1650 cm$^{-1}$.

According to another aspect of the present invention, there is provided a method of producing an electrochromic display element comprising at least an electrochromic layer of tungsten oxide and a solid electrolyte layer which are sandwiched between first and second conductive layers, which method comprises forming the electrochromic layer by vacuum deposition of the tungsten oxide on a substrate presented by another layer of the device such as the first or second conductive layer or the solid electrolyte layer, introducing oxygen as a reaction gas at a pressure of from $2 \times 10^{-5}$ torr to $1 \times 10^{-3}$ torr inclusive, at a deposition rate of from 0.1 nm/second to 0.4 nm/second inclusive, and at a surface temperature of the substrate of from 20° C. to 180° C. inclusive.

Thus, the present invention provides a writable ECD meeting the FT-IR spectrum absorbance conditions of the above formulae and a method by which such a writable ECD may be produced, wherein an EC substance layer of tungsten oxide is formed by vacuum deposition which is conducted with a specific reaction gas at specific levels of substrate temperature, pressure and deposition rate.

The FT-IR (Fourier transform infrared spectrum) absorption spectrum may be measured by commercially available apparatus. The absorption spectrum of the tungsten oxide is obtained by subtracting the absorption of the substrate alone from the absorption spectrum of the substrate provided with the tungsten oxide.

In the FT-IR measurement, the tungsten oxide must be measured when provided on the substrate surface in the same manner and condition as the ECD producing method. The substrate, however, may be different from the one provided with the tungsten oxide used in producing ECD, and thus a substrate suitable for FT-IR measurement such as a silicon wafer may be adopted.

The formulae (A) and (B) each provide comparisons of the heights of the peaks and the slopes of the base line in the respective absorption band regions.

In the formula (A), the absorption band ranging from 1600 $cm^{-1}$ to 1650 $cm^{-1}$ is assignable to the deformation (bending) vibration of a hydroxyl group, while the absorption band in the vicinity of 3400 $cm^{-1}$ is assignable to the stretching vibration thereof. The above (A) and (B) formulae show that the absorbance is specifically high at the absorption band of the hydroxyl group as compared with the absorbance in the vicinity thereof, and also that the hydroxyl group content in the tungsten oxide is high. In the absorption spectrum of the tungsten oxide by use of FT-IR, the absorption bands such as 1400 $cm^{-1}$, 1800 $cm^{-1}$, 2500 $cm^{-1}$ and 4000 $cm^{-1}$ are adopted as criteria in the formulae (A) and (B) because they do not form absorption bands for other spectra.

According to the method of the present invention, the EC substance layer can be formed by vacuum deposition on a substrate which may be provided by any of the first conductive layer, the second conductive layer, the solid electrolyte or any other, for example EC, layer present, at surface temperature of the substrate not less than 20° C. and not higher than 180° C. When the surface temperature of the substrate is less than 20° C. (at which room temperature often lies), a cooling system of high facility investment is required, resulting in a very high cost of production and making the vacuum deposition impossible in reality. When the substrate temperature is over 180°, the EC layer may not be writable due to colouring of the whole EC surface or spreading of the coloured area, making it difficult to recognize the written characters.

The vacuum deposition of the electrochromic layer of tungsten oxide should be conducted with the introduction of oxygen gas as the reaction gas, at pressure not less than $2 \times 10^{-5}$ torr and not more than $1 \times 10^{-3}$ torr. When the pressure is less than $2 \times 10^{-5}$ torr, the EC layer will no longer become writable due to colouring of the whole EC surface or spreading of the coloured area, making it difficult to recognize the written characters. When the pressure is over $1 \times 10^{-3}$ torr, the film forming by vacuum deposition takes much time, thereby decreasing productivity. The deposition rate when providing the tungsten oxide should be not lower than 0.1 nm/second and not higher than 0.4 nm/second. When such rate is less than 0.1 nm/second, it takes much time to form the film, thus decreasing the productivity. If the deposition rate is over 0.4 nm/second, the EC layer will not be writable because of colouring of the whole EC surface or spreading of the coloured area, making recognition of the written characters difficult.

In a preferred, all solid, ECD embodying the invention, the first conductive layer is arranged to receive a writing electrode, while the second conductive layer provides an opposite electrode. It is preferable for at least one of the first and second conductive layers to be transparent so that the colour change on the EC layer can be directly readable. However, alternatively, the colour change can be relayed to a monitor remote from the display device, in which case, neither layer need be transparent. Nevertheless, since it is especially preferred for at least the first conductive layer to be transparent, this is referred to hereinafter as the "display electrode".

Both the display electrode and the opposite electrode may comprise any of the materials ordinarily used in the usual ECD. Examples of such materials are metals such as gold, silver and aluminium, metal oxides such as indium-tin oxide, tin oxide and indium-antimony oxide, and mixture of two or more metals and/or metal oxides.

In addition, the choice of solid electrolyte layer is not particularly limited, so it may comprise any of the electrolytes usually used in the usual ECD, for example, dielectric substances such as metal oxides, for example tantalum oxide, zirconium oxide, hafnium oxide, titanium oxide and antimony oxide, and metal fluorides, for example, magnesium fluoride and lithium fluoride, polymer solid electrolytes comprising polyalkylene oxides to which are added metal salts, for example, lithium and sodium salts, and ion-exchange resins. Specifically, the metal oxides or metal fluorides are preferable for the production process in that transparency is high and vacuum deposition is possible, and that the EC layer may be formed by vacuum deposition (the production conditions for providing the solid electrolyte layer, are, of course, not necessarily the same as those for providing the EC layer). Tantalum oxide is most preferable in that it may result in a suitable display which is writable with less colour spreading.

The film forming method for providing the solid electrolyte layer may be selected in accordance with the properties of the solid electrolyte and is not particularly limited. However, vacuum deposition is preferable when tantalum oxide is used as the solid electrolyte.

Writing upon the display electrode of an all solid ECD embodying the present invention can be achieved by means of a surface writing electrode. Such an electrode may be of any electroconductive substance selected, for example, from metals, metal oxides and carbon. In addition, the electrode preferably has a shape such that it can draw readily and does not damage the display electrode. Specifically, it may take the shape of a bar with a rounded or pointed tip, which can be made to draw by pressing and writing at the same time, or the shape of a printing character head which can be made to "draw" by mere exertion of pressure.

An ECD according to the present invention comprises at least the EC substance layer, the solid electrolyte layer, the display electrode and the opposite electrode which together sandwich the EC substance layer and the solid electrolyte layer. The laminating order of these layers is not particularly limited but is preferably such that the solid electrolyte layer, EC substance layer and the display electrode layer, in that order, are formed on the opposite layer, for making the display more writable.

In one embodiment, the display electrode may be slightly separated from the EC layer, but be flexible to an extent such that, on exertion of pressure a part of the flexible display electrode is brought into contact with the EC layer to cause the change in colour in the region adjacent to the writing electrode. The display electrode may be spaced from the EC layer by, for example, a layer of particulate material disposed between them, the particles being movable or deformable on application of pressure to allow penetration of the display electrode, at the pressurized regions, for contact with the EC layer.

Furthermore, in an embodiment of the invention, an oxidation type EC substance layer may additionally be provided which changes from colourless to coloured by oxidation, together with a reduction type EC substance layer made of tungsten oxide. The constituents of the oxidation type EC substance layer may, for example, be iridium oxide or nickel oxide alone, or a mixture comprising at least these two substances. Thus, a so-called complementary ECD may be formed which has a structure comprising the solid electrolyte, the oxidation type EC substance layer, the reduction type EC substance layer, the display electrode and the opposite electrode, both sides of the solid electrolyte being contacted with the oxidation type EC substance layer and the reduction type EC substance layer, the oxidation type EC substance layer and the reduction type EC substance layer being further sandwiched between the display electrode and the opposite electrode.

The driving circuit and other components of the ECD according to the present invention are not particularly limited, and any that decorate the electrode and the electrolyte layer may be employed. The outline of ECD on this individual substances, the driving circuit and its purpose are described in detail in "The Current Process Technology" published by Koushinsha in 1987, and may be applicable to any ECD embodying the present invention.

An all solid ECD having the EC layer made of tungsten oxide according to the invention may be applied not only to the disclosed manual input display element but also to an element in combination with location detecting elements such as a touch panel, and a card with manual display function.

BRIEF DESCRIPTION OF THE DRAWINGS

Embodiments of the invention will now be described in more detail with reference to the following Examples and the accompanying drawings in which FIG. 3 is an illustration of a transmission spectrum of the tungsten oxide used in Comparative Example 1, as measured by FT-IR.

DESCRIPTION OF THE PREFERRED EMBODIMENTS AND BEST MODE FOR PRACTICING THE INVENTION

Example 1

(1) A glass substrate coated with a metal oxide film of an indium and tin mixture commercially available (hereinafter termed as ITO) was adopted as an opposite electrode. The surface temperature of he substrate was maintained at 100° C.

Figure 1:
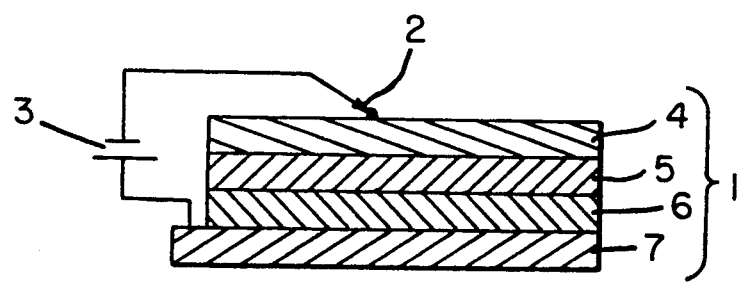
FIG. 1 is a sectional view of an ECD produced by the method of Example 1 embodying the present invention.

The solid electrolyte layer was formed as the first layer by vacuum depositing tantalum oxide on the substrate while introducing oxygen gas at pressure of $2 \times 10^{-4}$ torr. The EC substance layer was formed as the second layer by vacuum depositing tungsten oxide on the first layer while introducing oxygen gas under an oxygen pressure of $5 \times 10^{-5}$ torr. Both of the layers were formed at a deposition rate of 0.2 nm/second. In addition, the display electrode was formed as the third layer by providing ITO on the second layer by means of radio frequency ion-plating while introducing oxygen gas under an oxygen pressure of $1 \times 10^{-4}$ torr. The cross section of the resulting ECD is illustrated in FIG. 1. The ECD 1 shown in FIG. 1 has a writing electrode 2, a d.c. power source 3, a display electrode 4, an EC substance layer 5, a solid electrolyte layer 6, and an opposite electrode 7.

The ITO glass substrate and the writing electrode were connected to a positive electrode and a negative electrode, respectively to provide an applied voltage. A colouring reaction could then be made to occur at a specified portion touched with the writing electrode, thus enabling the ECD to be writable, as shown in FIG. 1, by contacting the writing electrode with the ITO surface deposited, followed by writing with normal speed and pressure. An aluminium bar with a tip diameter of 1 mm was used as the writing electrode. The characters maintained an approximately 1 mm width, which were clearly identified without spreading or narrowing the coloured portion. In addition, the written characters could be erased by contacting the writing electrode with the coloured portion of the ITO surface of the display electrode, when the ITO glass and the writing electrode were connected with the negative electrode and positive electrode, respectively, by applied voltage.

(2) A silicon wafer was used as a substrate with a surface temperature maintained at 100° C. A film of tungsten oxide was formed on the silicon wafer at a rate of 0.2 nm/second, while introducing oxygen gas under an oxygen pressure of $5 \times 10^{-5}$ torr by vacuum deposition under the same conditions as in (1). The absorption spectrum of the tungsten oxide obtained using an FT-IR spectrophotometer (IFS-113V, manufactured by Brucker) is illustrated in the FIG. 2. The spectrum illustrated is that obtained after substraction of the absorption spectrum of the silicon wafer substrate alone.

Figure 2:
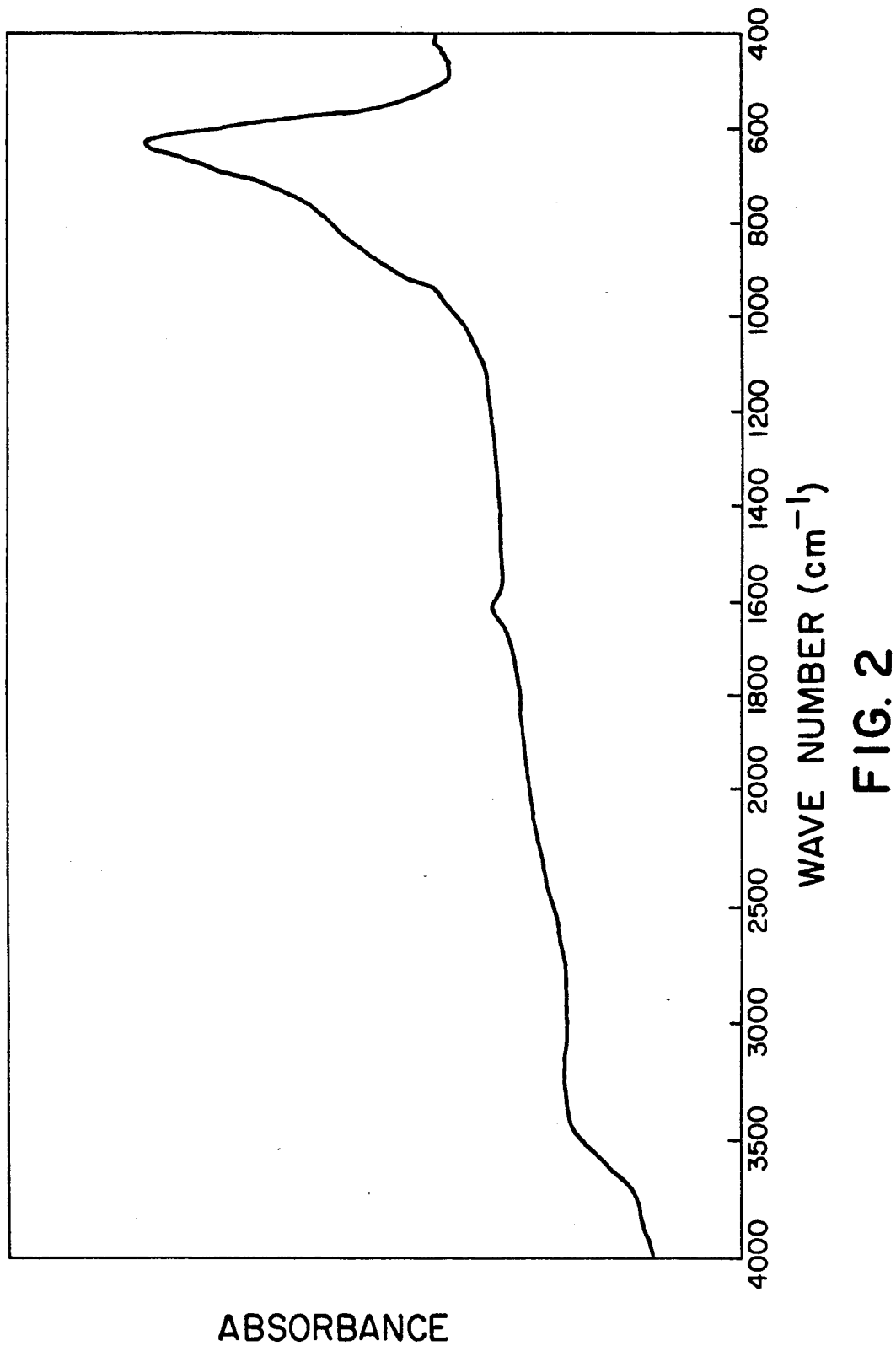
FIG. 2 is an illustration of an absorption spectrum of the tungsten oxide used in Example 1, as measured by FT-IR.

FIG. 2 shows that a peak is present which is assignable to the deformation vibration of the hydroxyl group near 1630 cm$^{-1}$ and another peak is present which is assignable to the stretching vibration of the same group near 3400 cm$^{-1}$. When each absorption of these peaks obtained by this spectrum was assessed by the formulae (A) and (B), respectively, the values obtained were 2.86 and 2.02 for (A) and (B), respectively, which met the required conditions of these formulae.

Comparative Example 1

(1) A glass substrate coated with a commercially available ITO was adopted as an opposite electrode. The surface temperature of the substrate was maintained at 280° C.

The solid electrolyte layer was formed as the first layer by vacuum depositing tantalum oxide on the substrate while introducing oxygen gas under a degree of vacuum of $2 \times 10^{-4}$ torr and the EC substance layer was formed as the second layer by vacuum depositing tungsten oxide on the first layer while introducing oxygen gas under an oxygen pressure of $5 \times 10^{-5}$ torr. Both of the layers were formed at the rate of 0.2 nm/second. In addition, the display electrode was formed as the third layer by providing ITO on the second layer by means of radio frequency ion-plating while introducing oxygen gas under an oxygen pressure of $1 \times 10^{-4}$ torr.

This ECD was subjected to a writing test in which a writing electrode was brought into contact with and moved along the deposited ITO surface at ordinary writing pressure and speed, with the ITO glass substrate and the writing electrode respectively connected to the positive and negative electrodes as in Example 1.

Characters written in this ECD could not be read due to coloration of the whole area of the ITO as the display electrode.

(2) A film of tungsten oxide was formed on a silicon wafer at a rate of 0.2 nm/second, while introducing oxygen gas under an oxygen pressure of $1 \times 10^{-5}$ torr by vacuum deposition under the same conditions as in Comparative Example 1. The absorption spectrum of the tungsten oxide obtained by FT-IR is illustrated in FIG. 3. FIG. 3 shows that a small peak is present which is assignable to the formation vibration of the hydroxyl group at around 1630 cm$^{-1}$ and a very little peak is present which is assignable to the stretching vibration of the same group at around 3400 cm$^{-1}$. When each absorption of these peaks obtained by this spectrum was assessed by means of the formulae (A) and (B), respectively, the values obtained were 1.67 and 1.30 for (A) and (B), respectively, which did not meet the required conditions of these formulae.

Comparative Example 2

An ECD was prepared under the same conditions as in Example 1 except that the substrate temperature was maintained at 300° C.

This ECD was subjected to a writing test in which a writing electrode was brought into contact with and moved along the deposited ITO surface at ordinary writing pressure and speed, with the ITO glass substrate and the writing electrode respectively connected to the positive and negative electrodes as in Example 1.

Characters written in this ECD could not be read due to coloration of the whole area of the ITO as the display electrode.

Comparative Example 3

An ECD was prepared under the same conditions as in Example 1 except that the oxygen pressure was $1 \times 10^{-5}$ torr when depositing the tungsten oxide layer. This ECD was subjected to a writing test in which a writing electrode was brought into contact with and moved along the deposited ITO surface at ordinary writing pressure and speed, with the ITO glass substrate and the writing electrode respectively connected to the positive and negative electrodes as in Example 1. The characters written in this ECD could not be read because, although the whole surface of the ITO was not colored, coloration spread to areas other than those contacted with the writing electrode.

Comparative Example 4

An ECD was prepared under the same conditions as in Example 1 except that the deposition rate of the tungsten oxide was 0.87 nm/second. This ECD was subjected to a writing test in which a writing electrode was brought into contact with and moved along the deposited ITO surface at ordinary writing pressure and speed, with the ITO glass substrate and the writing electrode respectively connected to the positive and negative electrodes as in Example 1. The characters written in this ECD could not be read because, although the whole surface of the ITO was not colored, coloration spread to areas other than those contacted with the writing electrode.

Comparative Example 5

An ECD was prepared in the same manner as in Example 1 except that the gas introduced was argon when depositing the tungsten oxide. This ECD was subjected to a writing test in which a writing electrode was brought into contact with and moved along the deposited ITO surface at ordinary writing pressure and speed, with the ITO glass substrate and the writing electrode respectively connected to the positive and negative electrodes as in Example 1. The characters written in this ECD could not be read because, although the whole surface of the ITO was not colored, coloration spread to areas other than those contacted with the writing electrode.

Example 2

An ITO glass substrate commercially available was used as an opposite electrode, the surface temperature of which was maintained at 100° C. Nickel oxide was vacuum deposited as an oxidation type EC substance layer on the ITO glass substrate. A complementary ECD was produced by forming tantalum oxide, tungsten oxide and ITO films in the same manner as in Example 1. This ECD was writable as in Example 1 and was also possible to erase the written letters.

Comparative Example 6

A complementary ECD was prepared in the same manner as in Example 2 except that the substrate of the surface temperature was maintained at 200° C. This ECD was coloured over its whole surface, so that the written characters were impossible to identify.

We claim:

1. An electrochromic display device comprising a first conductive layer capable of electrical connection to a writing electrode, a second conductive layer, spaced from said first conductive layer, and, sandwiched between said first and second conductive layers, at least an electrochromic layer of tungsten oxide and a solid electrolyte layer, wherein said tungsten oxide has an absorption spectrum, as measured by FT-IR, which meets the following formulae (A) and (B):

$$2.0 \leq \frac{A^* - A_{1800}}{(A_{1400} - A_{1800}) \times 0.44} \leq 5.0 \quad (A)$$

$$1.5 \leq \frac{A_{3400} - A_{4000}}{(A_{2500} - A_{4000}) \times 0.40} \leq 5.0 \quad (B)$$

wherein $A_{1400}$, $A_{1800}$, $A_{2500}$, $A_{4000}$, and $A_{3400}$, respectively, represent the absorbance at 1400 cm$^{-1}$, 1800 cm$^{-1}$, 2500 cm$^{-1}$, 4000 cm$^{-1}$, and 3400 cm$^{-1}$, and $A^*$ represents the highest absorbance within a range from 1600 cm$^{-1}$ to 1650 cm$^{-1}$.

2. An electrochromic display device according to claim 1, wherein said solid electrolyte layer comprises a material selected from the group consisting of metal oxides, metal fluorides, polymer solid electrolytes and ion-exchange resins.

3. An electrochromic display device according to claim 2, wherein said solid electrolyte layer comprises a metal oxide selected from the group consisting of tantalum oxide, zirconium oxide, hafnium oxide, titanium oxide and antimony oxide.

4. An electrochromic display device according to claim 3, wherein said metal oxide is tantalum oxide.

5. An electrochromic display device according to claim 2, wherein said solid electrolyte layer comprises a metal fluoride selected from the group consisting of magnesium fluoride and lithium fluoride.

6. An electrochromic display device according to claim 2, wherein said said electrolyte layer comprises a polymer solid electrolyte which is a polyalkylene oxide to which at least one metal salt is added.

7. An electrochromic display device according to claim 1, wherein said first conductive layer comprises at least one of one metal and metal oxide.

8. An electrochromic display device according to claim 7, wherein said first conductive layer comprises a metal selected from the group consisting of gold, silver and aluminum.

9. An electrochromic display device according to claim 7, wherein said first conductive layer comprises a metal oxide selected from the group consisting of indium-tin oxide, tin oxide and indium-antimony oxide.

10. An electrochromic display device according to claim 1, wherein said second conductive layer comprises a material which is at least one of one metal and metal oxide.

11. An electrochromic display device according to claim 10, wherein said second conductive layer comprises a metal selected from the group consisting of gold, silver and aluminum.

12. An electrochromic display device according to claim 10, wherein said second conductive layer comprises a metal oxide selected from the group consisting of indium-tin oxide, tin oxide and indium-antimony oxide.

13. An electrochromic display device according to claim 1, wherein said solid electrolyte layer, said electrochromic layer and said first conductive layer are formed in that order on said second conductive layer.

14. An electrochromic display device according to claim 1, wherein in addition to said electrochromic layer of tungsten oxide, an oxidation type electrochromic layer is sandwiched between said first and second conductive layers.

15. An electrochromic display device according to claim 14, wherein said oxidation type electrochromic layer comprises a material selected from the group consisting of iridium oxide and nickel oxide.

16. An electrochromic display device according to claim 14, wherein said electrochromic layer of tungsten oxide and said oxidation type electrchromic layer are formed with said solid electrolyte layer sandwiched therebetween.

17. An electrochromic display device according to claim 1, wherein at least one of said first and second conductive layers is transparent.

18. An electrochromic display device according to claim 1, wherein said first conductive layer and electrochromic layer are in contact with one another.

19. An electrochromic display device according to any one of claims 1 to 17, wherein said first conductive layer is brought into contact with said electrochromic layer by pressure.

20. An electrochromic display device according to claim 1 additionally comprising a writing electrode and an electric power source electrically connected between said second conductive layer and said writing electrode.

21. An electrochromic display device according to claim 1, wherein said solid electrolyte layer is disposed between said electrochromic layer and said second conductive layer.

* * * * *

UNITED STATES PATENT AND TRADEMARK OFFICE
CERTIFICATE OF CORRECTION

PATENT NO. : 5,157,540
DATED      : October 20, 1992
INVENTOR(S): Masayuki Kidai et al It is certified that error appears in the above-identified patent and that said Letters Patent is hereby corrected as shown below:

On the face of the patent, at [57] Abstract, the last line, after "layer" insert --, introducing oxygen as a reaction gas at pressure of from $2 \times 10^{-5}$ to $1 \times 10^{-3}$ torr, at deposition rate of from 0.2 to 0.4nm/second and at a substrate surface temperature of from 20°C to 130°C--.

Column 1, line 41, please change "$<10^{31} \; 5$" to --$<10^{-5}$--.

Signed and Sealed this

Twenty-fifth Day of November, 1997

*Attest:*

BRUCE LEHMAN

*Attesting Officer*          *Commissioner of Patents and Trademarks*